United States Patent [19]
Montoye et al.

[11] Patent Number: 5,541,528
[45] Date of Patent: Jul. 30, 1996

[54] CMOS BUFFER CIRCUIT HAVING INCREASED SPEED

[75] Inventors: Robert K. Montoye, Los Gatos; John J. Zasio, Sunnyvale; Creigton S. Asato, San Jose, all of Calif.; Tarang Patil, Phoenix, Ariz.

[73] Assignee: HAL Computer Systems, Inc., Campbell, Calif.

[21] Appl. No.: 519,443

[22] Filed: Aug. 25, 1995

[51] Int. Cl.$^6$ ................................................. H03K 19/20
[52] U.S. Cl. .......................... 326/34; 326/121; 327/537
[58] Field of Search ............................... 326/27, 31, 34, 326/17, 50, 121; 327/537, 541, 543

[56] References Cited

U.S. PATENT DOCUMENTS

| | | | |
|---|---|---|---|
| 4,874,967 | 10/1989 | Deane | 327/537 |
| 4,920,287 | 4/1990 | Hartgring | 327/537 |
| 5,184,030 | 2/1993 | Chung | 327/537 |
| 5,369,317 | 11/1994 | Casper | 327/543 |
| 5,408,191 | 4/1995 | Han | 327/543 |
| 5,455,527 | 10/1995 | Murphy | 326/58 |

*Primary Examiner*—Edward P. Westin
*Assistant Examiner*—Andrew Sanders
*Attorney, Agent, or Firm*—Skjerven, Morrill, MacPherson, Franklin & Friel; William L. Paradice, III

[57] ABSTRACT

A buffer circuit which exhibits increased speed in transitions between binary states. A control transistor is coupled between a pull-up transistor and an input terminal. During low-to-high input signal transitions, the control transistor limits the signal swing at the input terminal such that small variations in the input terminal voltage result in larger voltage variations at the output terminal. During such transitions, the control transistor simultaneously decouples the input terminal from the pull-up transistor, thereby decoupling the input capacitance from the pull-up transistor. As a result, the speed with which the pull-up transistor can pull the output high is increased. As the number of input signal desired to be processed increases, the reduction in logic transition time becomes more significant. Some versions further include a pull-down transistor having a control terminal coupled to the gate of the pull-up transistor and to a power-down terminal. When an appropriate voltage is applied to the power-down terminal, the pull-up transistor is turned off and the pull-down transistor is turned on such that no DC current flows in the circuit.

27 Claims, 8 Drawing Sheets

CMOS BUFFER CIRCUIT HAVING INCREASED SPEED

CROSS REFERENCES TO RELATED APPLICATIONS

This application is related to commonly owned U.S. patent application entitled "CMOS BUFFER CIRCUIT HAVING POWER-DOWN FEATURE" filed on Aug. 25, 1995, Ser. No. 08/519,444, incorporated herein by reference.

FIELD OF THE INVENTION

The present invention relates to buffer circuits and specifically to a CMOS buffer circuit having increased switching speed.

BACKGROUND OF THE INVENTION

In the semiconductor industry, there is a continuing desire for increased performance. In particular, the speed at which a particular circuit can transfer data or perform calculations is very important and often determines the circuit's marketability and appeal. Thus, any circuit which operates at an increased speed is very valuable.

Referring to FIG. 1, a conventional CMOS buffer circuit 10, shown as part of a CMOS NOR gate 11, is configured as a sense amplifier. A plurality of input signal lines $A_0$–$A_n$ are coupled to input node A via N-channel MOS pull-down transistors $MN_0$–$MN_n$, respectively. A P-channel MOS "weak" pull-up transistor $MP_1$ is connected between the voltage supply $V_{DD}$ and input node and, having its gate connected to ground potential, remains in a conductive state. Buffer/driver 12 receives a signal at node A and, in response thereto, drives output terminal Z. Capacitor $C_o$ models the capacitive nature of a load connected to circuit 10 at output terminal Z.

If all input signals $A_0$–$A_n$ are logic low, none of pull-down transistors $MN_{A0}$–$MN_{An}$ will conduct. Current flow through transistor $MP_1$ will thus charge node A to approximately $V_{DD}$, thereby pulling node A high. If, on the other hand, one or more of input signals $A_0$–$A_n$ is logic high, then one or more of associated pull-down transistors $MN_{A0}$–$MN_{An}$ will conduct and, in discharging node A, will pull node A low. In order to be consistent with CMOS levels and to ensure compatibility between buffer circuit 10 and other CMOS logic circuits, the signal swing of output terminal Z, and thus node A, should be approximately from ground to $V_{DD}$, where $V_{DD}$ is 3.3 volts.

Charging and discharging node A between zero and 3.3 volts in order to effect logic transitions results in buffer circuit 10 having undesirably limits the switching speed of circuit 10. Further, noting that each of pull-down transistors $MN_{A0}$–$MN_{An}$ capacitively loads node A, increasing the number of input signals A coupled to circuit 10 via pull-down transistors $MN_A$ increases the capacitance between node A and ground and, therefore, necessarily decreases the switching speed of circuit 10. The capacitive load at node A thus requires an undesirable balancing between speed and signal handling capability.

SUMMARY

A buffer circuit is disclosed which not only operates at an increased switching speeds but also eliminates the undesirable dependence of switching speed upon the number of pull-down transistors, and thus input signals, coupled thereto. In accordance with one embodiment of the present invention, a feedback signal is provided from an output terminal to a control transistor. This feedback signal turns on the control transistor during low-to-high input signal transitions. Once turned on, this control transistor limits the voltage swing at the input node. A CMOS inverter coupled to the input node produces a CMOS-level output signal indicative of the binary state of the input node. Accordingly, since small variations in voltage at the input node result in CMOS-level voltage swings at the output terminal, i.e., the input node does not have to be completely charged and discharged between CMOS levels, the speed of logic transitions is increased.

In another embodiment of the present invention, a buffer circuit includes a control transistor coupled between the pull-up transistor and the input node. During low-to-high input signal transitions, the control transistor limits the signal swing at the input node, thereby increasing the speed of logic transitions. The control transistor simultaneously decouples the input node from the pull-up transistor and, accordingly, decouples the input capacitance from the pull-up transistor. Thus, the speed with which the pull-up transistor pulls the output high is increased. As the number of input signals provided to the buffer circuits is increased, the reduction in logic transition time becomes more significant.

In yet another embodiment, one or more current sources are provided in parallel with the pull-up transistor to more quickly charge the output during low-to-high switching transitions. In applications where the input changes logic states only during a predetermined portion of a clock cycle, a pulse signal is used to control the on and off states of the current sources such that the current sources are on only during portions of the clock cycle when the input may changes. Since these current sources are turned off during portions of the clock cycle when the inputs are not changing logic states, power dissipation is minimized.

In the preferred embodiments, the above-described buffer circuits include a pull-down transistor having a gate coupled to the gate of the pull-up transistor and to a power-down terminal. When an appropriate voltage is applied to the power-down terminal, the pull-up transistor is turned off and the pull-down transistor is turned on such that no DC current flows in the circuit.

DETAILED DESCRIPTION OF THE PREFERRED EMBODIMENT

Figure 1:
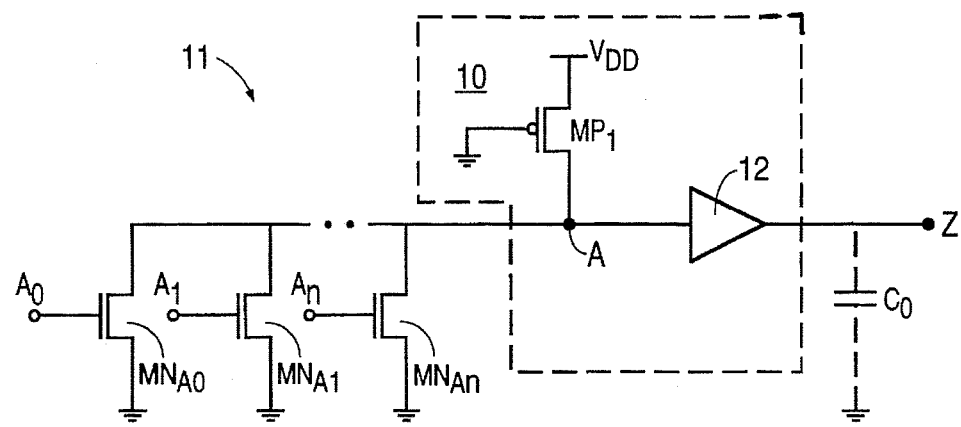
FIG. 1 is a schematic diagram of a conventional buffer circuit shown as part of a CMOS NOR gate.
Figure 2:
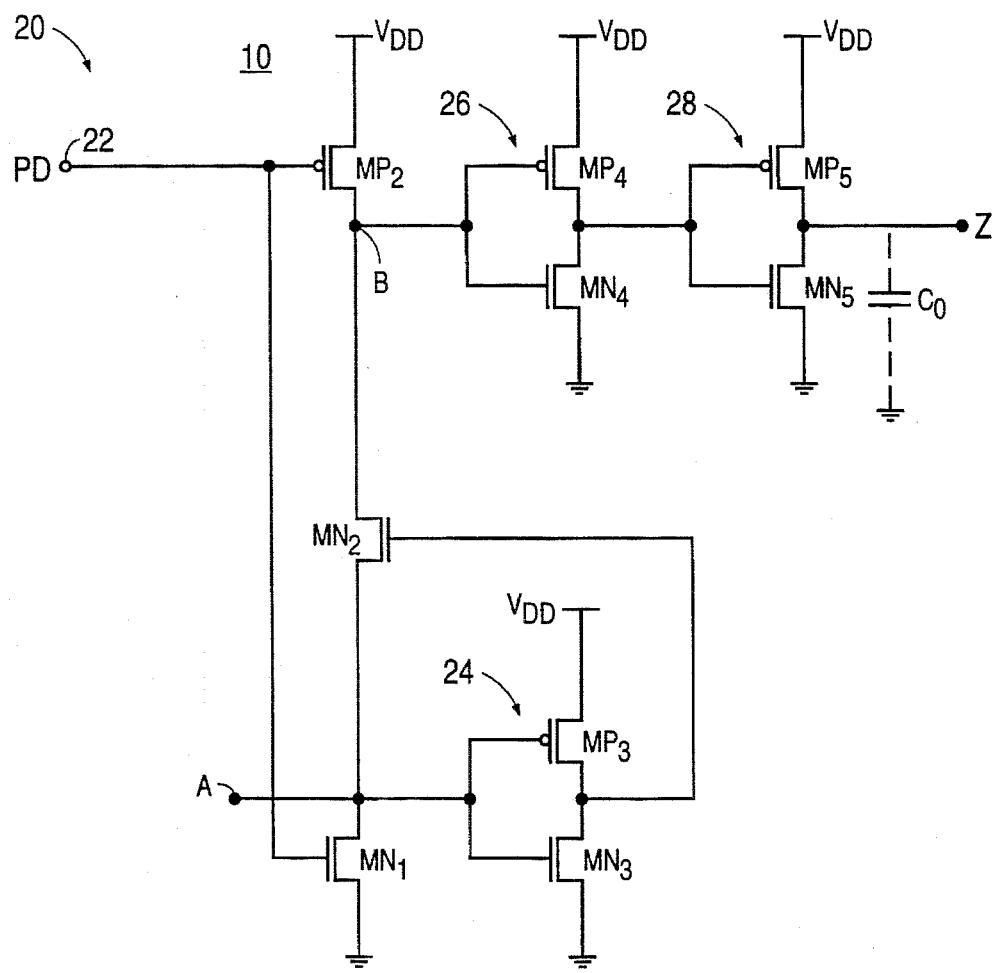
FIG. 2 is a schematic diagram of a buffer circuit in accordance with a first embodiment of the present invention.

FIG. 2 shows a CMOS buffer circuit 20 in accordance with a first embodiment of the present invention. Although not shown for simplicity, any number of input signals may be coupled to input node A via pull-down transistors. It should be noted that the particular configuration of pull-down transistors coupling such input signals to buffer circuit 20 may vary, depending upon the intended application of buffer circuit 20. For instance, where it is desired to employ circuit 20 in the implementation of an n-input NOR gate, an input configuration such as pull-down transistors $MN_{A0}$–$MN_{An}$ of FIG. 1 may be employed.

Circuit 20 includes a power-down terminal 22 connected to the gate of a P-channel "weak" pull-up transistor $MP_2$ and to the gate of an N-channel pull-down transistor $MN_1$. During normal operating mode, a logic low power-down signal PD is provided to power-down terminal 22 such that transistor $MP_2$ is on and transistor $MN_1$ is off. During power-down mode, PD is logic high, thereby turning off transistor $MP_2$ and turning on transistor $MN_1$. In this mode, no DC current flows through transistor $MP_2$. In addition to reducing the total power dissipation of circuit 20, this power-down feature also allows for $I_{DDQ}$ testing of circuit 20, as discussed in Applicants' above-referenced copending application entitled "CMOS BUFFER CIRCUIT HAVING POWER-DOWN FEATURE".

A control transistor $MN_2$ is connected in series between pull-up transistor $MP_2$ and pull-down transistor $MN_1$ and has a gate connected to the output of a CMOS inverter 24 formed by a P-channel transistor $MP_3$ and an N-channel transistor $MN_3$. The input terminal of inverter 24 is connected to input node A. The node common to transistors $MN_2$ and $MP_2$ will hereinafter be referred to as node B. Connected in series between node B and output terminal Z are CMOS inverters 26 and 28, where inverter 26 is formed by a P-channel transistor $MP_4$ and an N-channel transistor $MN_4$, and inverter 28 is formed by a P-channel transistor $MP_5$ and an N-channel transistor $MN_5$. Capacitor $C_o$ models the capacitive nature of a load (not shown) at output terminal Z.

For the discussion of circuit 20 that follows, it is assumed that node A is initially low. The particular voltage of node A in its logic low state may vary between 0 and 0.6 volts, depending upon how many input pull-down transistors (not shown) are conducting, e.g., pulling node A low. As such, it is assumed that node A, when pulled low, will be at approximately 0.6 volts. When node A is low, the output of inverter 24 is high (at approximately $V_{DD}$), thereby causing control transistor $MN_2$ to conduct.

When the input signals (not shown) are such that none of the input pull-down transistors (not shown) are pulling node A low, transistors $MP_2$ and $MN_2$ begin to pull node A high toward $V_{DD}$. The threshold voltage of inverter 24 is set to approximately 1.0 V so that when the voltage at node A reaches approximately 1.0 V, the output of inverter 24 goes low and turns off control transistor $MN_2$. Acting as a switch, control transistor $MN_2$ decouples input node A from node B and, 1accordingly, clamps node A at approximately 1.0 V. The input capacitance of circuit 20, that is, the capacitive load at node A resulting from the coupling of input pull-down transistors (not shown) to node A, is effectively decoupled from node B. This decoupling allows transistor $MP_2$ to more quickly pull node B high to $V_{DD}$. In this state, no DC current flows in circuit 20, thereby reducing power dissipation.

When one or more of the input signals transition high, their associated input pull-down transistors quickly pull node A low. Note that the decoupling of node A from node B allows node A to be pulled low faster than if node A were coupled to node B. As node A falls below approximately 1.0 volt, the output of inverter 24 transitions high and turns on control transistor $MN_2$, thereby re-coupling nodes A and B. The gate delay of inverter 24, as well as the turn-on time of control transistor $MN_2$, advantageously allows node A to be quickly pulled to a voltage below the threshold voltage, i.e., approximately 1.0 volt, of inverter 24 before nodes A and B are re-coupled via control transistor $MN_2$. Once turned on, control transistor $MN_2$ acts as a weak pull-up transistor to resist the action of the stronger input pull-down transistors from pulling node A all the way to ground. Where only one of the input pull-down transistors is conducting, control transistor $MN_2$ may prevent node A from dropping below 0.6 volts. Increasing numbers of input pull-down transistors that are conducting will, of course, result in node A being pulled closer to ground.

The above described embodiment achieves superior switching speeds over conventional CMOS buffers. Control transistor $MN_2$ advantageously limits the swing of node A to approximately 1 volt. As mentioned earlier, as node A is pulled high to approximately 1.0 volt, the input capacitance of buffer circuit 20 is decoupled from node B. This decoupling feature reduces the time required to charge and discharge node B and, accordingly, allows buffer circuit 20 to more quickly transition between logic states. As the number of input signals provided to buffer circuit 20 via pull-down transistors is increased, the reduction in logic transition time due to this decoupling feature becomes even more pronounced.

Inverters 26 and 28 act as a buffer between output terminal Z and node B and ensure that the signal swing at output terminal Z is consistent with CMOS logic levels.

Figure 3:
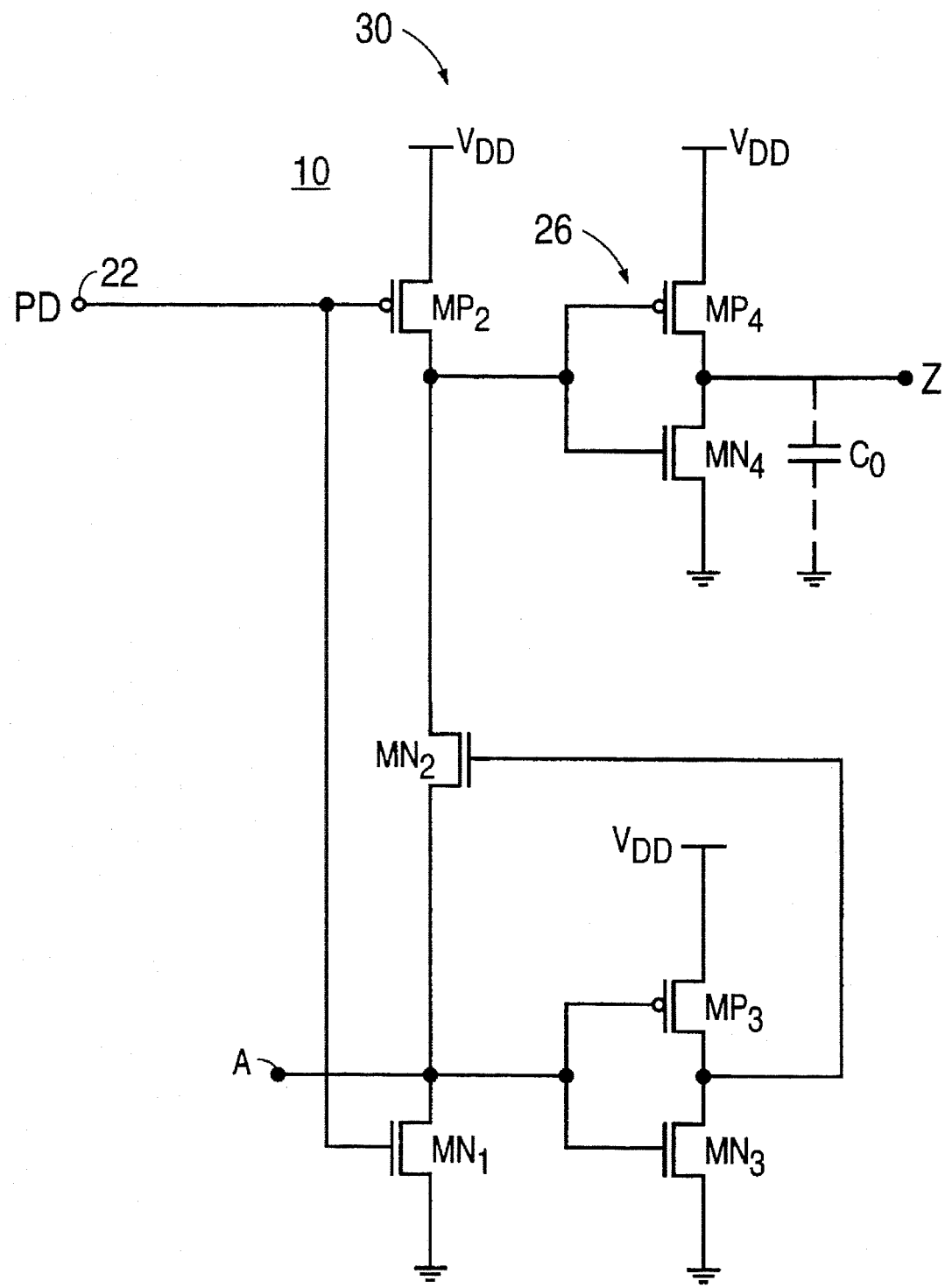
FIG. 3 is a schematic diagram of a buffer circuit in accordance with a second embodiment of the present invention.

FIG. 3 shows a second embodiment of the present invention. The operation of buffer circuit 30 (FIG. 3) is identical to that of buffer circuit 20 (FIG. 2) in every respect but one. Given the same input signals, the output signal provided by buffer circuit 30 (FIG. 3) will be the logical complement of the output signal provided by buffer circuit 20 (FIG. 2).

Figure 4:
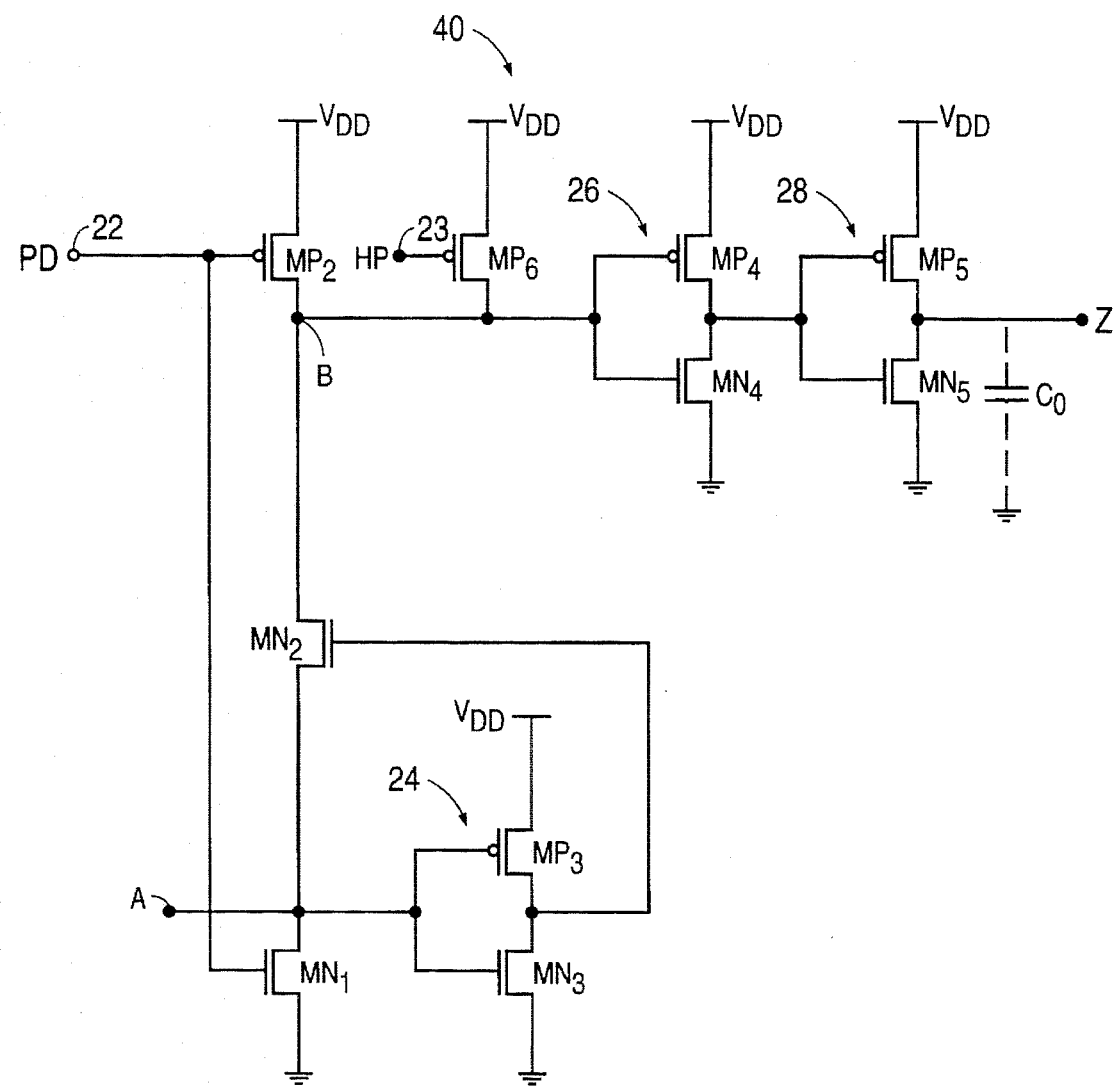
FIG. 4 is a schematic diagram of a buffer circuit in accordance with a third embodiment of the present invention.

FIG. 4 shows a third embodiment of the present invention. Buffer circuit 40 includes all the features of buffer circuit 20 (FIG. 2), and the description above relating to buffer circuit 20 applies equally to buffer circuit 40. Accordingly, those features in common to the embodiments of FIGS. 2 and 4 are denoted with the same symbols.

Buffer circuit 40 employs an additional P-channel pull-up transistor $MP_6$ coupled between node B and $V_{DD}$ to improve performance. The gate of transistor $MP_6$ is connected to a high-power control terminal 23. When a low high-power control signal HP is applied to terminal 23, transistor $MP_6$ conducts and, acting as a current source, provides additional current to node B. During low-to-high logic transitions, this additional current provided by transistor $MP_6$ results in a faster charging of node B and thereby increases the speed of low-to-high logic transitions.

The additional current provided by transistor $MP_6$, however, increases the power dissipation of buffer circuit 40. The total power dissipation may, however, be minimized by pulsing the HP control signal provided to terminal 23 such that transistor $MP_6$ conducts only during portions of the clock cycle in which input node A is switching logic states. Thus, during those portions of the clock cycle when input node A is not switching logic states, transistor $MP_6$ is turned off to reduce current flow in buffer circuit 40, thereby reducing power dissipation. During such "non-switching" portions of the clock cycle, transistor $MP_2$ remains on and provides minimal current so as to maintain the present logic state of output terminal Z.

Figure 5:
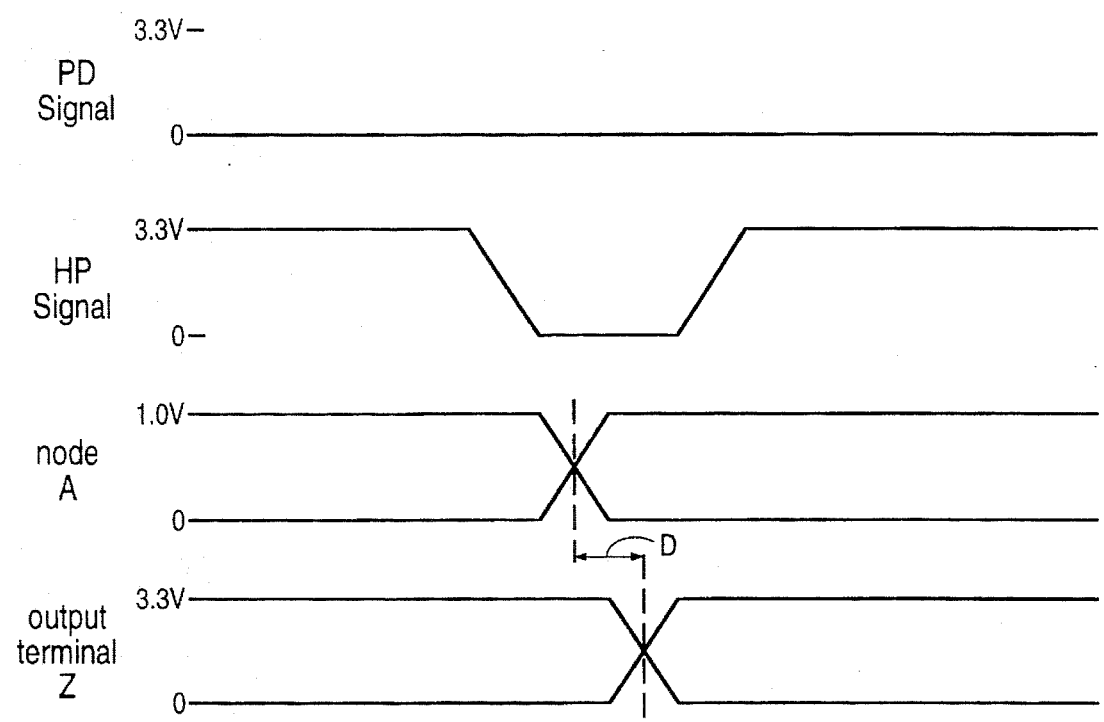
FIG. 5 is a timing diagram for control signals used in the operation of embodiments of the present invention.

FIG. 5 is a timing diagram illustrating the pulsing of high-power control signal HP in relation to switching transitions of input node A and output terminal Z, where D represents the propagation delay of buffer circuit 40. In some embodiments, a monostable-multivibrator (not shown) is used to pulse terminal 23 low during portions of the clock cycle when input node A is switching. Such a multivibrator is well known in the art and thus will not be discussed below. In other embodiments, a conventional self-timed pulse generator may be employed to turn off transistor $MP_6$ when input node A is not switching logic states.

In other embodiments, CMOS inverter 28 may be removed from buffer circuit 40 such that output terminal Z is directly coupled to the output of inverter 26, thereby resulting in a buffer circuit (not shown) whose output is the logical complement of that of buffer circuit 40.

Figure 6:
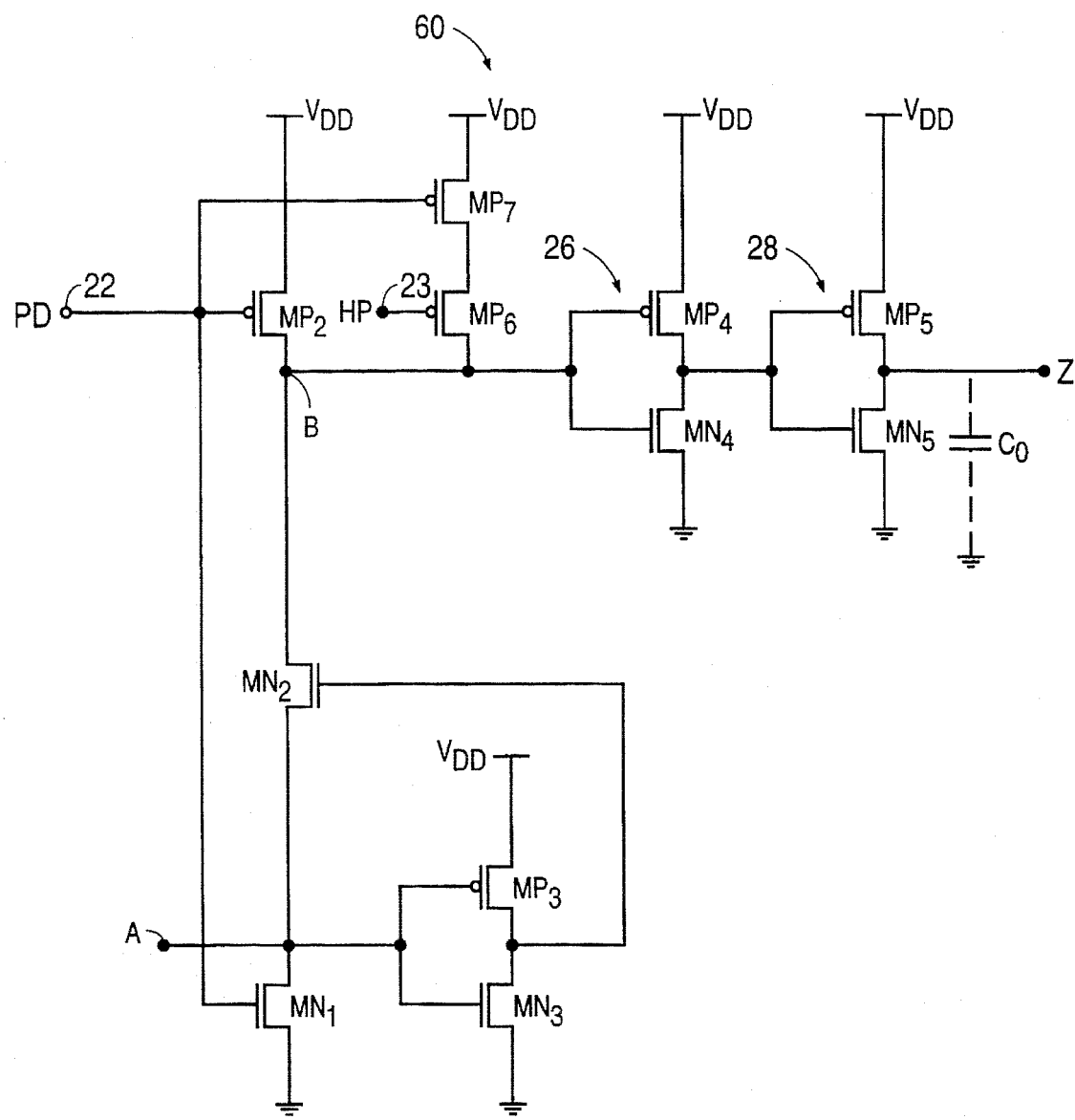
FIG. 6 is a schematic diagram of a buffer circuit in accordance with a fourth embodiment of the present invention.

FIG. 6 shows a fourth embodiment of the present invention. Buffer circuit 60 includes all the features of buffer circuit 40 (FIG. 4), and the description above relating to buffer circuit 40 applies equally to buffer circuit 60. Accordingly, those features in common to the embodiments of FIGS. 4 and 6 are denoted with the same symbols.

Buffer circuit 60 (FIG. 6) includes a P-channel transistor $MP_7$ connected in series between $V_{DD}$ and transistor $MP_6$. The gate of transistor $MP_7$ is connected to power-down terminal 22. During normal operating mode, power-down terminal 22 is held low such that buffer circuit 60 operates in a manner identical to that of buffer circuit 40 (FIG. 4). During power-down mode, PD signal goes high, turning off transistors $MP_2$ and $MP_7$ and turning on transistor $MN_1$. In this state, no DC current flows through buffer circuit 60, thereby reducing power dissipation and allowing for $I_{DDQ}$ testing, as discussed earlier, of circuit 60.

Figure 7:
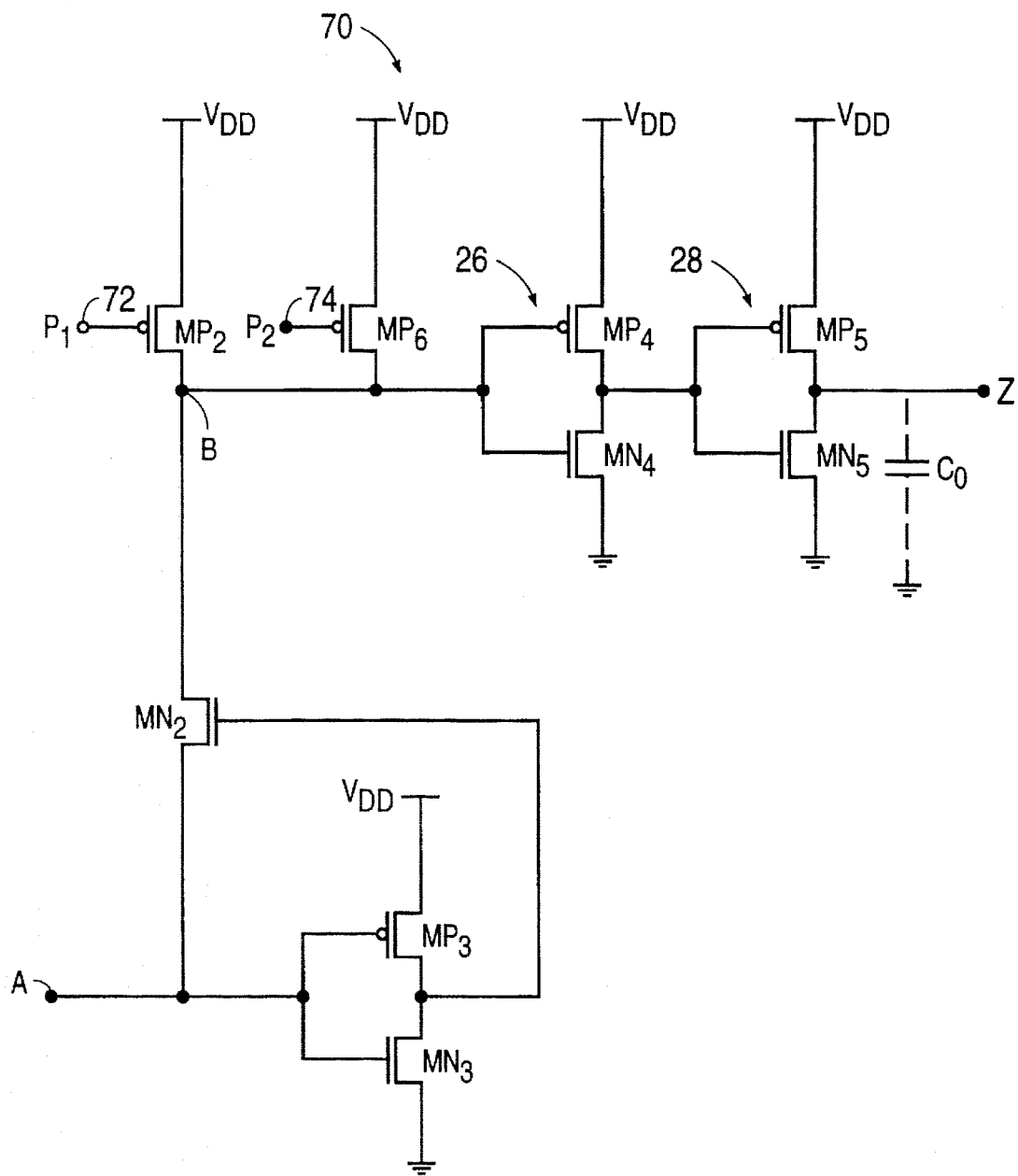
FIG. 7 is a schematic diagram of a buffer circuit in accordance with a fifth embodiment of the present invention.

FIG. 7 shows a fifth embodiment in accordance with the present invention. Buffer circuit 70 includes all the features of buffer circuit 60 (FIG. 6) except for the power-down feature discussed above. Accordingly, those features in common to the embodiments of FIGS. 6 and 7 are denoted with the same symbols. Transistors $MP_2$ and $MP_6$ of circuit 70 act as independently-controllable current sources and have their gates connected to control terminals 72 and 74, respectively. The conductive states of transistors $MP_2$ and $MP_6$ are controlled by pulse signals $P_1$ and $P_2$, respectively. Thus, the amount of current sourced to node B via transistors $MP_2$ and $MP_6$ may be accurately controlled by adjusting the duty cycles of pulse signals $P_1$ and $P_2$, respectively, thereby allowing the operating characteristics of circuit 70 to be easily adjusted. For example, decreasing the duty cycles of pulse signals $P_1$ and $P_2$ results in respective transistors $MP_2$ and $MP_6$ sourcing more current to node B which, in turn, increases the switching speed of circuit 70. Conversely, increasing the duty cycles of pulse signals $P_1$ and $P_2$ results in more current being sourced to node B, thereby reducing power dissipation of circuit 70 (and also reducing switching speed). Pulse signals $P_1$ and $P_2$ may have the same or different duty cycles depending upon the desired operating characteristics of circuit 70. In other embodiments, additional independently-controllable current sources may be added in parallel with transistors $MP_2$ and $MP_6$ to allow even greater flexibility and control over the operating characteristics of circuit 70.

In other embodiments, buffer circuit 70 may be used as part of a synchronous system where the input signals switch during predetermined portions of a clock cycle. In such embodiments, transistor $MP_6$ is preferably several times larger than transistor $MP_2$ and, acting as a high-current source, is turned on during portions of the clock cycle when the input is switching to increase switching transition times. Transistor $MP_6$ is turned off during those portions of the clock cycle when the inputs are not changing to reduce power dissipation. Transistor $MP_2$, acting as a low-current source, is turned on when the input signals are not switching in order to maintain the current logic state at output terminal Z. The conductivity of transistors $MP_2$ and $MP_6$ may be controlled by a monostable-multivibrator, or any other conventional logic circuitry. This low/high current switching feature is advantageous since it allows circuit 70 to switch as fast as those circuits which have only a high-current source, while simultaneously dissipating less power by sourcing a reduced current to node A during part of the clock cycle. Transistors $MP_2$ and $MP_6$ may both be turned off to eliminate static power dissipation.

Figure 8:
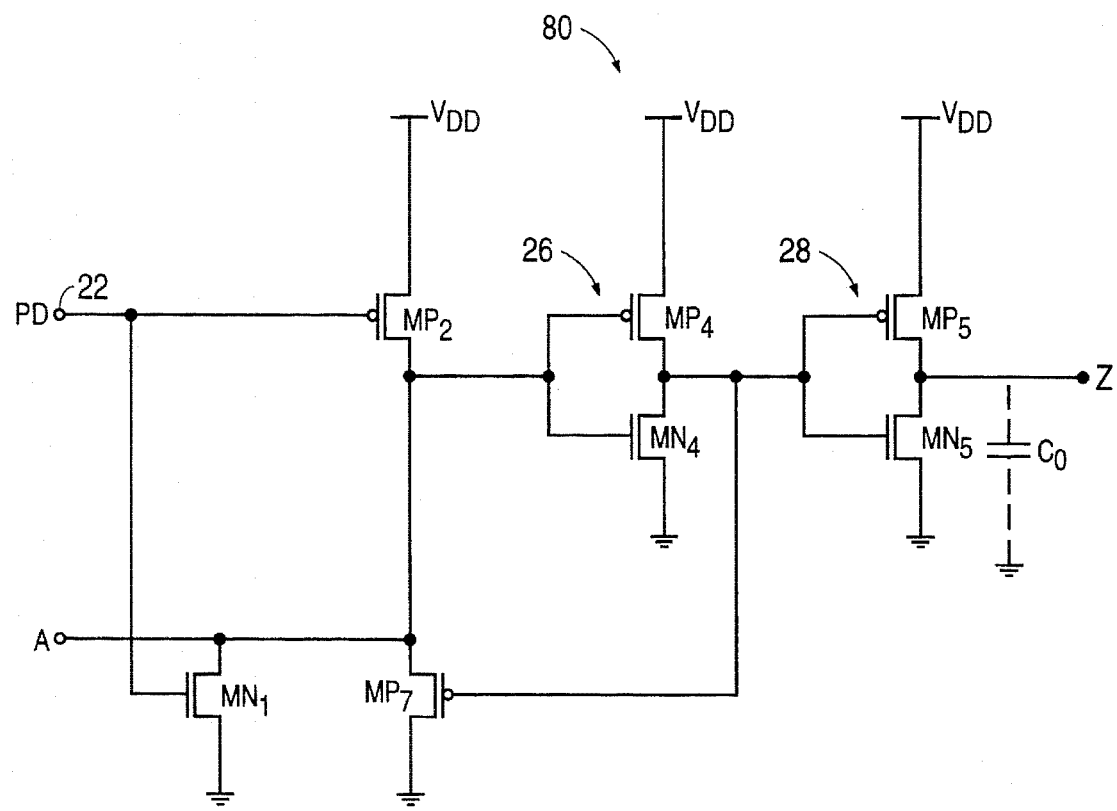
FIG. 8 is a schematic diagram of a buffer circuit in accordance with a sixth embodiment of the present invention.

FIG. 8 shows a sixth embodiment in accordance with the present invention. The operation of buffer circuit 80 is similar to that of buffer circuit 20 (FIG. 2) and, accordingly, those components common to circuit 80 and circuit 20 are similarly denoted. Buffer circuit 80 includes a power-down terminal 22 connected to the gates of transistors $MP_2$ and $MN_1$ and, accordingly, has a power-down feature identical to the power-down feature discussed above with regard to buffer circuit 20 (FIG. 2).

Circuit 80 also includes a control transistor $MP_7$ connected in series between pull-up transistor $MP_2$ and ground. The gate of control transistor $MP_7$, which is preferably a P-channel MOS device, is connected to the output of CMOS inverter 26. For the discussion of circuit 80 that follows, it is assumed that input signals are coupled to buffer circuit 80 at node A via input pull-down transistors (not shown). It is further assumed that node A is initially at a logic low. In this state, the output of inverter 26 is high, thereby keeping control transistor $MP_6$ in a non-conducting state and forcing output terminal Z low to approximately ground.

When the input signals transition to a state such that none of their associated input pull-down transistors are conducting, pull-up transistor $MP_2$ begins pulling node A high. The threshold voltage of inverter 26 is set such that as node A reaches approximately 1.0 volts, the output of inverter 26 goes low which, in turn, forces output terminal Z high. This low signal at the output of inverter 26 simultaneously turns on control transistor $MP_7$. Now conducting, control transistor $MP_7$ and pull-up transistor $MP_2$ form a voltage divider which clamps the voltage at node A from exceeding approximately 1.1 volts, thereby preventing node A from charging all the way to $V_{DD}$. In other words, as node A reaches approximately 1.1 volts, control transistor $MP_7$ turns on and, acting as a weak pull-down transistor, pulls node A low toward ground.

When one or more of the input signals change logic states, the input pull-down transistors will begin to pull node A low. As node A falls below approximately 1.0 volt, the output of inverter 26 goes high, turning off control transistor $MP_7$ and forcing output terminal Z low to approximately ground Clamping the voltage of node A at 1.1 volts in the manner discussed above advantageously limits the signal swing at node A. Accordingly, since node A is charged to and discharged from only a fraction of $V_{DD}$, charging and discharging times of node A are reduced, thereby increasing the switching speed of circuit 80.

Unlike buffer circuit 20 (FIG. 2), buffer circuit 80 does not decouple the input capacitance of the input pull-down transistors connected to node A on low-to-high logic transitions. As a result, it may be advantageous to employ buffer circuit 20, rather than buffer circuit 80, in applications requiring a large number of input signals.

However, in applications requiring a relatively small number of input signals (i.e., fewer than 16), buffer circuit 80 may be advantageous over buffer circuit 20 since circuit 80 does not include CMOS inverter 24 and, thus, does not have the delay associated therewith. Optimally choosing between implementations in accordance with FIGS. 2 and 8, requires a balancing between the charging time of node A and the gate delay of inverter 24.

In other embodiments, CMOS inverter 28 may be removed from buffer circuit 80 such that output terminal Z is directly coupled to the output of inverter, thereby resulting in a buffer circuit (not shown) whose output is the logical complement of that of buffer circuit 80. If the above-described power-down feature is not desired, transistor $MN_1$ may be removed and node 22 tied to ground.

Figure 9:
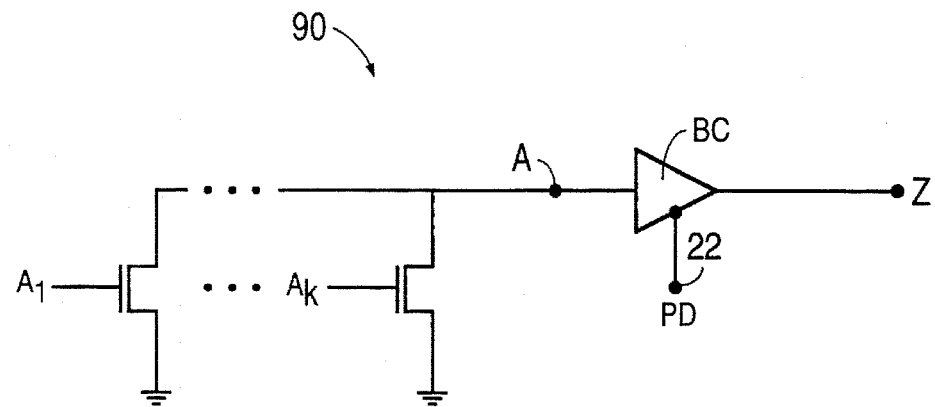
FIGS. 9 and 10 illustrate different implementations of embodiments in accordance with the present invention.

The buffer circuits described above may be used in a variety of logic applications. For instance, the buffer circuits described above may be implemented as part of a k-input NOR gate 90, as shown in FIG. 9, where box BC denotes any one of the buffer circuits described above in accordance with the present invention. If any of inputs signals $A_1$–$A_k$ are high (i.e., approximately $V_{DD}$), output terminal Z goes low (i.e., approximately $V_{SS}$). If, on the other hand, all of inputs signal are low, then output terminal Z goes high. Power down terminal 22 may be used as described above to eliminate static power dissipation.

Figure 10:
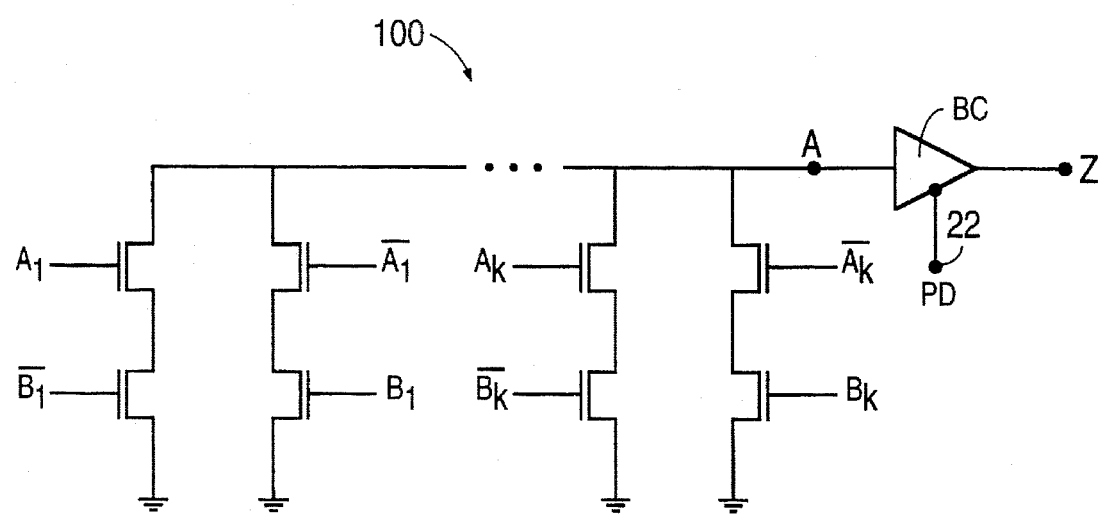

As another example, the buffer circuits described above may be used as part of a k-bit equality detector 100, as shown in FIG. 10. If, for any given pair of input signals $A_i$ and $B_i$, $A_i$ is not logically equal to $B_i$, then node A will be pulled low which, as discussed above with respect to FIG. 2, forces output terminal Z low. If, on the other hand, $A_i$ equals $B_i$ for all values of i between 1 and k, node A will be pulled high (to approximately 1.0 V) and, as discussed above, output terminal Z will be pulled high. Power down terminal 22 may be used to turn off static power dissipation.

It is to be understood that the above described embodiments, although described and shown as MOS components, may be implemented in other technologies such as bipolar, CMOS, or BiCMOS.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A buffer circuit comprising:

an input terminal for receiving one or more input signals;

a pull-up transistor having a control terminal coupled to a power-down terminal, a first current-handling terminal coupled to a first reference voltage, and a second current handling terminal;

a control transistor having a control terminal, a first current-handling terminal coupled to said input terminal, and a second-current handling terminal coupled to said second current-handling terminal of said pull-up transistor;

an inverter having an input terminal coupled to said input terminal and having an output terminal coupled to said control terminal of said control transistor; and an output terminal connected to said second current-handling terminal of said pull-up transistor.

2. The structure of claim 1 wherein said inverter comprises a CMOS device.

3. The structure of claim 1 further comprising a second inverter coupled between said second current handling terminal of said pull-up transistor and said output terminal.

4. The structure of claim 3 further comprising a third inverter coupled between said second inverter and said output terminal.

5. The structure of claim 4 wherein said second and third inverters comprise CMOS devices.

6. The structure of claim 1 wherein said pull-up transistor comprises a P-channel MOS device.

7. The structure of claim 1 wherein said control transistor comprises an N-channel MOS device.

8. The structure of claim 1 further comprising a pull-down transistor having a control terminal coupled to said power-down terminal, a first current-handling terminal coupled to a second reference voltage, and a second current-handling terminal coupled to said input terminal, wherein the application of a predetermined voltage to said power-down terminal turns off said pull-up transistor and turns on said pull-down transistor such that no DC current flows in said buffer circuit.

9. The structure of claim 6 wherein said power-down terminal is connected to ground potential such that said pull-up transistor is always in a conductive state.

10. The structure of claim 8 wherein said pull-up transistor and said pull-down transistor comprise P-channel and N-channel MOS devices, respectively.

11. A buffer circuit comprising:

an input terminal for receiving one or more input signals;

a first pull-up transistor having a control terminal coupled to a first control terminal, a first current-handling terminal coupled to a first reference voltage, and a second-current handling terminal coupled to a reference node;

a second pull-up transistor having a control terminal coupled to a second control terminal, a first current-handling terminal coupled to said first reference voltage, and a second current-handling terminal coupled to said reference node;

a control transistor having a control terminal, a first current-handling terminal coupled to said input terminal, and a second current-handling terminal coupled to said reference node;

an inverter having an input terminal coupled to said input terminal and having an output terminal coupled to said control terminal of said control transistor; and an output terminal connected to said reference node.

12. The structure of claim 11 further comprising a second inverter coupled between said reference node and said output terminal.

13. The structure of claim 12 further comprising a third inverter coupled between said second inverter and said output terminal.

14. The structure of claim 13 wherein said inverters comprise CMOS devices.

15. The structure of claim 11 wherein said first and second pull-up transistors comprise P-channel MOS devices.

16. The structure of claim 11 wherein said control transistor comprises an N-channel MOS device.

17. The structure of claim 11 further comprising a pull-down transistor having a control terminal coupled to said first control terminal, a first current-handling terminal coupled to a second reference voltage, and a second current-handling terminal coupled to said input terminal.

18. The structure of claim 17 wherein said pull-down transistor comprises an N-channel MOS device.

19. The structure of claim 17 wherein said first reference voltage is approximately 3.3 volts and said second reference voltage is ground potential.

20. The structure of either claims 11 or 17 further comprising a third pull-up transistor coupled between said second pull-up transistor and said first reference voltage, said third pull-up transistor having a control terminal to said first control terminal.

21. The structure of claim 20 wherein said third pull-up transistor comprises a P-channel MOS device.

22. A buffer circuit comprising:

an input terminal for receiving one or more input signals;

an output terminal;

a pull-up transistor having a control terminal coupled to a power-down terminal, a first current-handling terminal coupled to a first reference voltage, and a second current-handling terminal coupled to said input terminal and to said output terminal; and a control transistor having a control terminal coupled to said output terminal, a second current-handling terminal coupled to said input terminal, and a first current-handling terminal coupled to a second reference voltage.

23. The structure of claim 22 wherein said pull-up transistor and said control transistor comprise P-channel MOS devices.

24. The structure of claim 23 further comprising an inverter coupled between said input terminal and said output terminal.

25. The structure of claim 24 further comprising a second inverter coupled between said first-mentioned inverter and said output terminal.

26. The structure of claim 25 wherein said first and second inverters comprise CMOS devices.

27. The structure of claim 22 further comprising a pull-down transistor having a control terminal coupled to said power-down terminal, a first current-handling terminal coupled to said second reference voltage, and a second current-handling terminal coupled to said input terminal, wherein application of a predetermined voltage to said power-down terminal turns off said pull-up transistor and turns on said pull-down transistor such that no DC current flows in said buffer circuit.

\* \* \* \* \*

UNITED STATES PATENT AND TRADEMARK OFFICE
CERTIFICATE OF CORRECTION

PATENT NO.    :   5,541,528
DATED         :   July 30, 1996
INVENTOR(S)   :   Montoye et al It is certified that error appears in the above-identified patent and that said Letters Patent is hereby corrected as shown below:

Col. 3, line 64, delete "1accordingly" and insert -- accordingly--.

Signed and Sealed this

Seventh Day of January, 1997

Attest:

BRUCE LEHMAN

Attesting Officer    Commissioner of Patents and Trademarks